United States Patent [19]

Ooi et al.

[11] Patent Number: 5,057,907
[45] Date of Patent: Oct. 15, 1991

[54] METHOD AND STRUCTURE FOR FORMING VERTICAL SEMICONDUCTOR INTERCONNECTION

[75] Inventors: Boon K. Ooi, Cupertino; Shiann-Ming Liou, Campbell; Ka-Heng The, Los Altos; Norman L. Gould, San Jose, all of Calif.

[73] Assignee: National Semiconductor Corp., Santa Clara, Calif.

[21] Appl. No.: 535,838

[22] Filed: Jun. 11, 1990

[51] Int. Cl.$^5$ .................... H01L 39/02; H01L 23/28; H01L 23/48
[52] U.S. Cl. ........................................ 357/80; 357/72; 361/398
[58] Field of Search ................... 357/72, 80; 361/398, 361/400, 409, 412

[56] References Cited

U.S. PATENT DOCUMENTS

| | | | |
|---|---|---|---|
| 3,353,069 | 11/1967 | Slavin | 361/398 |
| 3,827,056 | 7/1974 | Vano | 347/74 |
| 4,074,419 | 2/1978 | Hanni et al. | 29/625 |
| 4,266,282 | 5/1981 | Henle et al. | 365/52 |
| 4,426,689 | 1/1984 | Henle et al. | 365/52 |
| 4,684,974 | 8/1987 | Matsanaza et al. | 357/68 |
| 4,879,629 | 11/1989 | Tustaniwskyj et al. | 365/385 |

FOREIGN PATENT DOCUMENTS 61-088547  5/1986  Japan ..................... 357/80

OTHER PUBLICATIONS

"Microelectronics Packaging Handbook", Edited by R. Tummala & E. Rymaszewski, Van Nostrand Reinhold (1989), New York.

Primary Examiner—Andrew J. James
Assistant Examiner—Stephen D. Meier
Attorney, Agent, or Firm—S. Caserza; Lee Patch; Michael Glenn

[57] ABSTRACT

An integrated circuit package includes a plurality of TAB assemblies, each including a portion for inner lead bonding an integrated circuit. A portion of the tape is formed to allow the tape to be outer lead bonded to the substrate so that the integrated circuit is mounted at any desired non zero angle with respect to a horizontal substrate. A plurality of formed tape units are outer lead bonded to a horizontal substrate. In one embodiment, the die is inner lead bonded to the tape in an area which is not devoid of tape, allowing electrical traces on the tape which are routed above and not in contact with the surface of the die, thereby providing excellent routing density. The dielectric tape may include a single electrical interconnect layer, or a plurality of electrical interconnect layers which may themselves be electrically interconnected via suitable vias formed within the tape structure. In one embodiment, the portion of the tape opposite the area to which the integrated circuit die is to be inner lead bonded includes secondary metallization regions. Suitable vias in the tape contact these secondary metallization regions to selected ones of the metallic leads which are to be inner lead bonded to the integrated circuit. In one embodiment of this invention, the secondary metallization areas are fabricated sufficiently large to allow the mounting of additional components, for example chip capacitors used to filter the supply voltages applied to the integrated circuit. A method for forming is also taught.

6 Claims, 7 Drawing Sheets

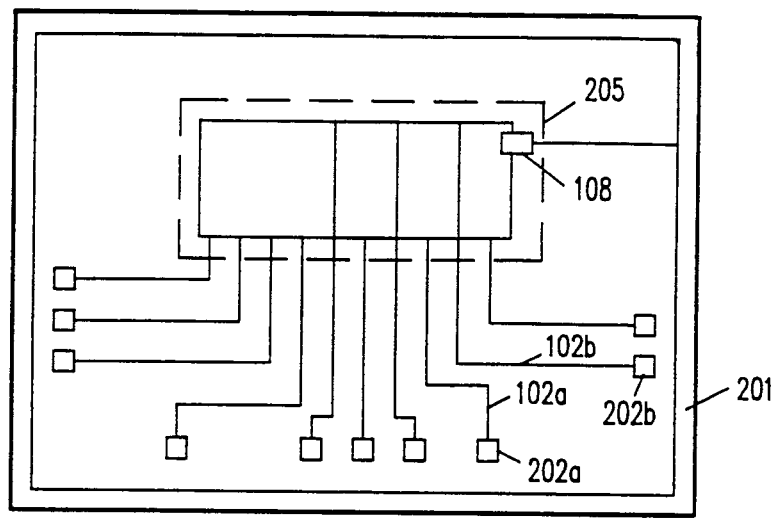
FIG. 2
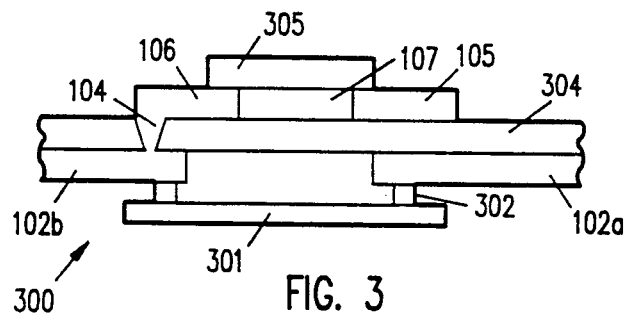
FIG. 3
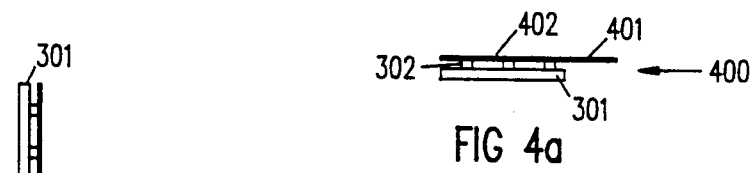
FIG 4a
FIG. 4b
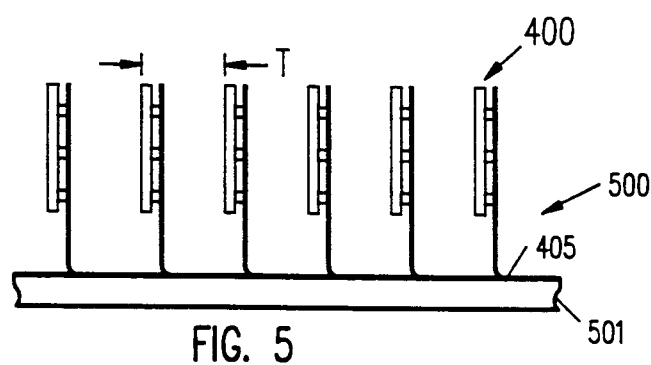
FIG. 5

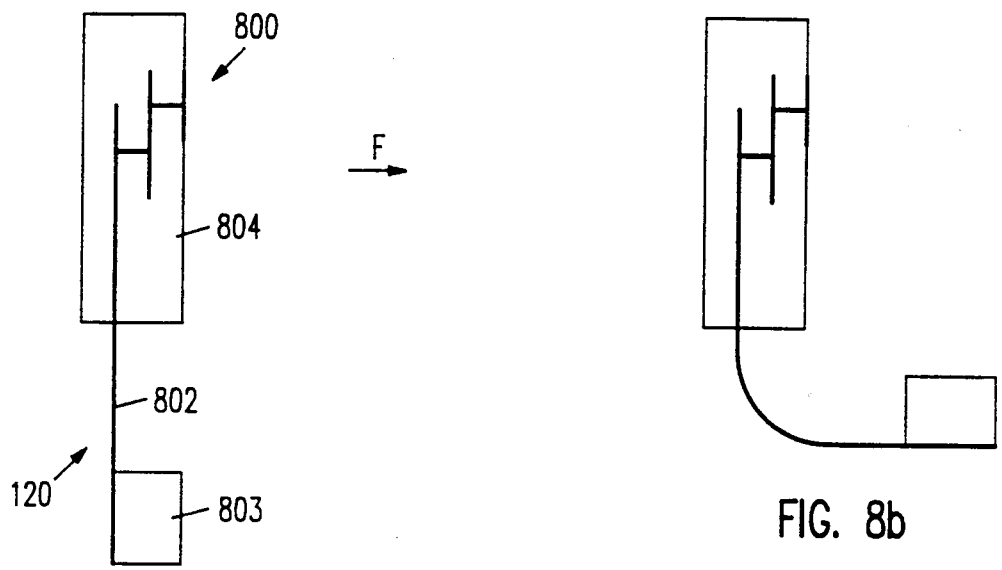
FIG. 8a
FIG. 8b
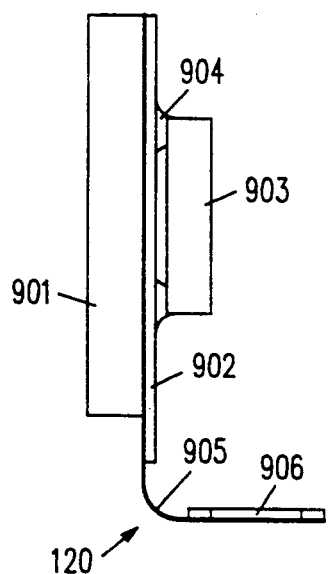
FIG. 9

METHOD AND STRUCTURE FOR FORMING VERTICAL SEMICONDUCTOR INTERCONNECTION

RELATED APPLICATIONS

This applications is related to co-pending U.S. Pat. application Ser. No. 07/535,837 filed on June 11, 1990 on an invention of Millerick and Pautsch entitled "Vertical Semiconductor Interconnection Method and Structure".

BACKGROUND

This invention pertains to integrated circuits and more specifically to the packaging of integrated circuits such that they may be electrically connected to other circuitry.

The fabrication of integrated circuits is a complex art. However, the art of packaging relatively fragile integrated circuit chips in order to protect them, provide electrical interconnection to other devices, and remove what often amounts to a significant quantity of heat, is also a very complex art. A continuing state of technological advancement in the packaging of integrated circuits has been necessary in order to keep up with the advances made in integrated circuit complexity, density, and speed. In addition, it is highly desirable to provide such state of the art integrated circuit packaging in a reliable low cost manner, while minimizing the yield loss encountered in the packaging process.

In addition to the need for packaging modern, high density integrated circuits having, in some cases, a large number of electrical pins, it has also become essential to be able to assemble a plurality of integrated circuit devices in a single electronic system or subsystem. Such systems or subsystems also require a low cost, reliable, high yield method for assembling a plurality of integrated circuit devices in a small area and in a manner such that a substantial amount of heat may be removed.

It is known, for example, to mount a plurality of integrated circuit dice on a substrate, such as a ceramic substrate or a printed circuit board, and provide wire interconnections from the dice to the substrate. The integrated circuit dice are then encapsulated, utilizing a suitable compound such as one of a variety of epoxies. It is also known in the prior art to provide electrical connection to an integrated circuit die utilizing tape automated bonding (TAB). The tape includes a predefined pattern of electrical traces including portions extending out into a window generally centrally located, which exposed leads are used for inner lead bonding (ILB) to raised metallic bumps formed on the bonding pads of the integrated circuit die or on the tape. The traces on the tape extend to an outer edge where they are exposed for the purposes of outer lead bonding (OLB) to a lead frame, which is then encapsulated with a suitable epoxy in order to form a dual in line package (DIP) including package leads for electrical connection to other circuitry. For higher density application, packages have been developed which include more than one row of leads associated with each edge of the package. Surface mount devices (SMD) have been developed which either include small leads, or which are leadless, and which are designed for mounting on the surface of a printed circuit board without requiring a through hole formed in the printed circuit board. In yet another approach, the TAB outer lead bonding is made directly to a printed circuit board.

A good description of a wide variety of packaging techniques is provided in "Microelectronics Packaging Handbook," edited by R. Tummala & E. Rymaszewski, Van Nostrand Reinhold (1989), New York.

Another technique for packaging integrated circuits is described in U.S. Pat. No. 4,426,689 issued Jan. 17, 1984, to Henle et. al. Henle et. al. describe the assembly of integrated circuit dice by vertically mounting them on a horizontal substrate. Henle et. al. describe a first embodiment where all bonding pads on an integrated circuit die are located along one edge such that appropriate bonding techniques can be used to electrically and physically connect the integrated circuit bonding pads to corresponding electrical connection regions on the surface of the substrate. This allows a plurality of integrated circuit dice to be vertically mounted on a horizontal substrate in close proximity, thereby providing high packaging density.

Henle et. al. also describes the use of TAB for assembling the plurality of dice to the substrate. Henle et. al. describes TAB mounting a plurality of dice, which may have their bonding pads located along more than one edge. In this embodiment of Henle et. al., each die is mounted by inner lead bonding bumps formed on the bonding pads of the die to metallic fingers which extend into a window region of the tape, such that the dice are suspended within their associated windows. Henle et. al. then bend the tape in order to form a convoluted tape structure having dice suspended in the windows in a vertical fashion with respect to the horizontal substrate. Portions of the convoluted tape structure which do not contain the integrated circuit dice are formed substantially parallel to the surface of the substrate to allow outer lead bonding of the convoluted tape structure to appropriate metallic interconnects located on the surface of the substrate. Henle et. al. describe that the portions of the metallic traces on the tape which are to be used for outer lead bonding are formed in an open window, i.e. they extend into the window devoid of tape.

Henle et. al. describe the formation of a right angle connector for use in the first embodiment of their invention which does not utilize TAB. Henle et. al. describe that a metallic connector is bonded to the bonding pads and then clamped in a suitable tool. The integrated circuit die is then rotated with respect to the clamping device thereby causing the leads to be bent. This technique is also apparently used by Henle et. al. for causing the tape used in the second embodiment of Henle et. al. to be formed in a convoluted structure, i.e. clamping the portions of the tape which are to be outer lead bonded to the substrate, and which holds an integrated circuit die rotated with respect to the clamped portion of the tape.

Thus, Henle et. al. describe a TAB packaging technique in which a plurality of integrated circuit dice are inner lead bonded on a single piece of tape, which is then convoluted and outer lead bonded to a substrate, thereby connecting a plurality of integrated circuit dice to the substrate as one unit.

It is therefore one objective of this invention to provide a semiconductor package with increased interconnect density.

It is another objective of the present invention to provide a semiconductor package with increased yield, by allowing testing of individual components prior to assembly, and a reworking of the device by the replacement of individual assemblies, if needed.

SUMMARY OF THE INVENTION

In accordance with the teachings of this invention, a novel method for forming an integrated circuit package structure is taught. A plurality of TAB assemblies are formed, each such assembly including a portion of tape to which is inner lead bonded an integrated circuit. The tape unit is then formed such that a portion of the tape is at a desired non zero angle to the surface of the integrated circuit. The tape is outer lead bonded to the substrate in such a manner that the integrated circuit is mounted at any desired non zero angle with respect to a horizontal substrate, for example, substantially vertical to the horizontal substrate. A non-perpendicular arrangement will reduce the overall height of the assembly. A plurality of such formed tape units are outer lead bonded to a horizontal substrate providing a high density electronic subsystem.

If desired, the bonding pads may be fabricated on any one or more edges of the integrated circuit die. In one embodiment, the bonding pads are formed along two opposite edges of the integrated circuit die. In another embodiment, the bonding pads are formed anywhere on the surface of the integrated circuit die, including regions interior to its periphery. In one embodiment, the die is inner lead bonded to the tape in an area which is not devoid of tape. In this embodiment, electrical traces on the tape are capable of being routed above and not in contact with the surface of the die, by providing excellent routing density. The dielectric tape may include a single electrical interconnect layer, or a plurality of electrical interconnect layers which may themselves be electrically interconnected via suitable vias formed within the tape structure.

In one embodiment of this invention, the portion of the tape opposite the area to which the integrated circuit die is to be inner lead bonded includes secondary metallization regions. Suitable vias in the tape connect these secondary metallization regions to selected ones of the metallic leads which are to be inner lead bonded to the integrated circuit. In one embodiment of this invention, the secondary metallization areas are fabricated sufficiently large to allow the mounting of additional components, for example chip capacitors used to filter the supply voltages applied to the integrated circuit.

In accordance with the teachings of this invention, a novel technique for forming the bend in the interconnection structure is taught. The bend in the interconnection structure is necessary to provide a foot which is to be outer lead bonded to a substrate, the foot and the substrate being substantially horizontal, with the remainder of the interconnection structure, upon which an integrated circuit die is inner lead bonded, being formatted at a desired non-zero angle with respect to the substrate. In accordance with this invention, the area where the bend is to take place is fabricated to be substantially free of dielectric tape, so that the metallic leads will be formed to a precise and predictable angle without the deleterious effects of unpredictable angle formation caused if a large amount of the dielectric tape was to remain in the area of the bend.

In accordance with the teachings of this invention, the tape interconnect structure is formed by holding fixed that portion of the tape to which the integrated circuit die is inner lead bonded, while forming the foot by applying a lateral force thereto, with respect to the fixed integrated circuit die.

BRIEF DESCRIPTION OF THE DRAWINGS

FIG. 2 is a plan view depicting a tape carrier formed within a suitable frame;

FIG. 3 is a cross-sectional view depicting the structure of FIG. 1 to which has been attached an integrated circuit die and the chip capacitor;

FIG. 4A is a cross-sectional view depicting one embodiment of a tape carrier of FIG. 1, including an integrated circuit die;

FIG. 4B is a cross-sectional view depicting the structure of FIG. 4A after it has been formed;

FIG. 5 is a cross-sectional view depicting a portion of the substrate including a plurality of tape mounted integrated circuits in accordance with the teaching of this invention;

FIGS. 8a and 8b depict a tape structure of this invention, before and after forming;

FIG. 9 depicts a tape structure of this invention, after forming; and

DETAILED DESCRIPTION

Figure 1:
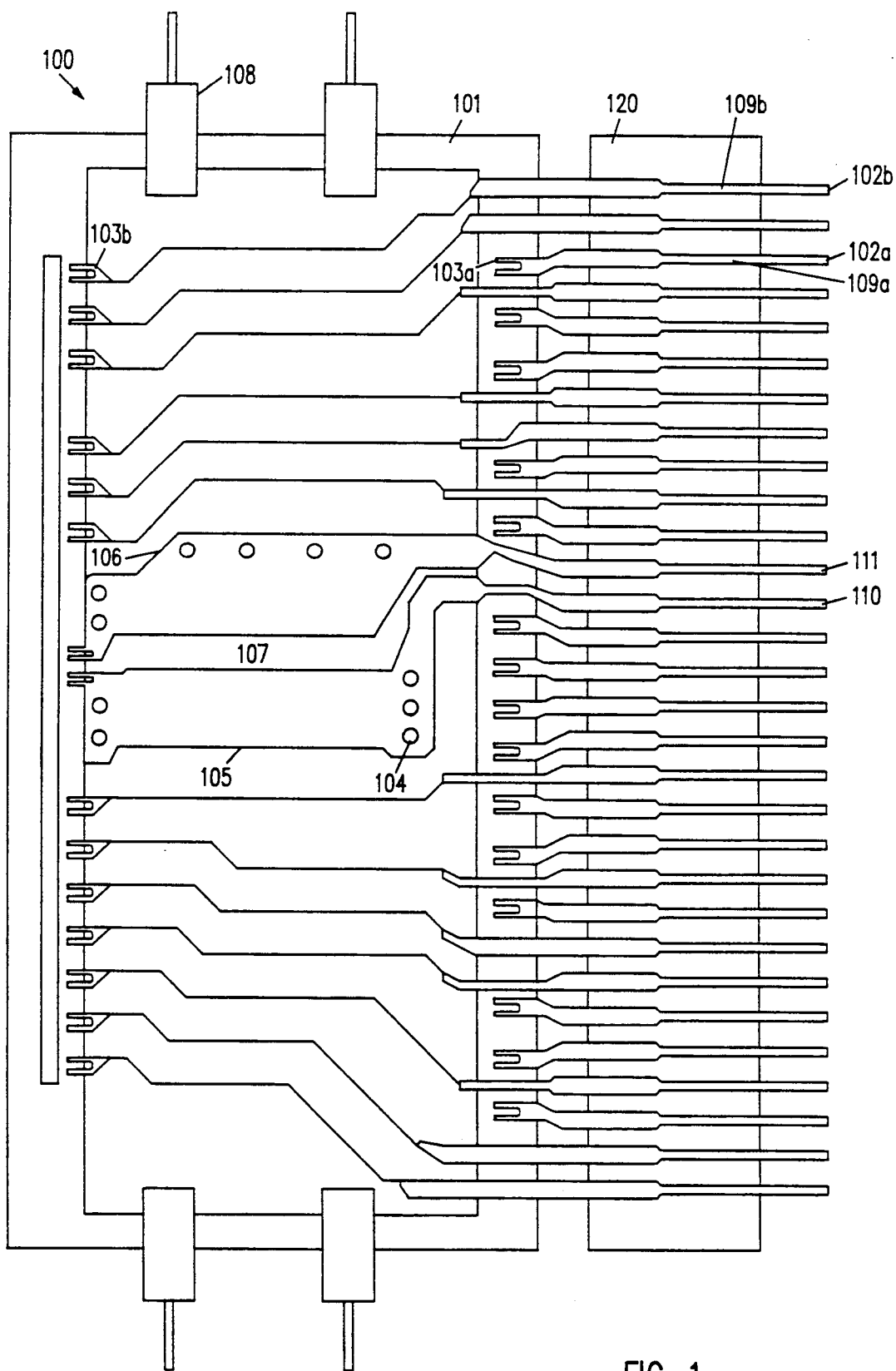
FIG. 1 is a composite view depicting one embodiment of the tape carrier constructed in accordance with the teachings of this invention.

FIG. 1 is a composite view depicting one embodiment of a tape carrier constructed in accordance with the teachings of this invention. Tape carrier 100 may be thought of as a solid sheet of film, except in those areas where film is absent, as will be now described. Tape carrier 100 includes a plurality of metal traces such as metal traces 102a and 102b. Metal trace 102a, for example, extends from its inner lead bonding region 103a, to a distant location (not shown) which is readily accessible for use during testing of the integrated circuit die when mounted on tape carrier 100. In one embodiment, ILB portion 103a of metallic interconnect lead 102a is formed within window 101 which is devoid of tape on at least one surface of ILB portion 103a. In one embodiment, the ILB portion of the metallic interconnect leads are formed such that the metallic leads are exposed for inner lead bonding. In an alternative embodiment, the portion of the metallization leads which are to be inner lead bonded are covered with dielectric tape, which is then bonded "through" for inner lead bonding. In the embodiment shown in FIG. 1, metallic structural support means 108 are used in order to provide mechanical support between that portion of the tape located within window 101, and an outer frame (not shown, but described later with reference to FIG. 2).

In one embodiment, bonding pads are provided along only one side of the integrated circuit die which is to be mounted to tape assembly 100. In such an embodiment, ILB portions of metallic leads need only be provided on the edge of the die to which ILB portions 103a will be bonded. However, the embodiment of FIG. 1 is an example of a tape structure 100 for use in inner lead bonding to an integrated circuit die which includes bonding pads on two opposite edges. In accordance with this embodiment, tape is included within window 101, thereby allowing metallic traces to be formed on that portion of the tape which overlays the integrated circuit which will be inner lead bonded to tape structure 100.

Also shown in FIG. 1 are those portions of metallic leads 109a and 109b which are the general vicinity at which the outer lead bonding will be performed to connect tape structure 100 to a substrate (not shown). The metallic leads for inner lead bonding are, in one embodiment, fabricated free of dielectric film. In an alternative embodiment, they are covered with dielectric film which then bonded "through" to perform the outer lead bonding. Of importance, in accordance with the teachings of this invention, window 120 is formed of a convenient size such that areas 109a and 109b, which are to be outer lead bonded, are substantially free of dielectric tape. Thus, leads 102a and 102b, for example, are essentially suspended in air within window 120. The provision of window 120 in the area where the bend is to occur is a key feature of this invention in that it allows the bend to be made to a precise and predictable angle due to the absence of the film in this area which would otherwise lead to unpredictable and wide variations in the formed angle from unit to unit. As shown in FIG. 1, metallic leads such as 102a and 102b extend beyond the outer lead bond areas 109a and 109b. Tape carrier 100 is formed generally within a suitable frame 201, as shown in FIG. 2. This allows metallic lead such as 102a and 102b to extend toward frame 201 for connection to suitable areas which are easily connected by test equipment, thereby providing access to test an inner lead bonded integrated circuit.

Once tested, that portion of the tape assembly which lies generally within dashed boxed 205 is removed from frame 201 for forming and outer lead bonding to a substrate.

Also, referring again to FIG. 1, one embodiment of tape assembly 100 includes secondary metallization regions 105 and 106 on its surface opposite where the integrated circuit is to be mounted. In one embodiment, metallization regions 105 and 106 are used to connect power signals to an external component which is mounted on metallization regions 105 and 106. Such an external component may comprise, for example, a chip capacitor of small physical size which is used for the well known purpose of decoupling the power supply signal provided to the integrated circuit. As shown in FIG. 1, metallic portions 105 and 106 are separated by region 107 across which will extend the external component. Metallization regions 105 and 106 are conveniently connected by the use of vias 104 to metallization on the opposite side of the tape, which metallization is used for either or both inner lead and outer lead bonding.

FIG. 3 depicts the cross-sectional view of the structure of FIG. 1 to which has been inner lead bonded integrated circuit die 301 and to which has been attached chip capacitor 305. As shown in FIG. 3, integrated circuit 301 includes bumps 302 formed on its bonding pad, for example in a well known manner. Integrated circuit die 301 is inner lead bonded via bumps 302 to metallic leads 102a and 102b formed on tape carrier 304. On the opposite side of tape 304 are located the metallic areas 105 and 106, to which is connected an external component, such as chip capacitor 305. Electrically separating metallic regions 105 to 106 is dielectric region 107 which comprises either tape or simply a gap. For purposes of illustration, metallization portion 106 is connected to lead 102b by way of via 104 which is formed through tape 304.

FIG. 4a depicts generally the structure of FIG. 3, although for the sake of simplicity chip capacitor 305 of FIG. 3 is not shown in FIG. 4a. However, it is readily understood that chip capacitor 305 would, if used, be electrically and mechanically attached generally to area 402 on the side of tape 401 opposite where integrated circuit die 301 is inner lead bonded. An individual integrated circuit tape unit 400 as shown in FIG. 4a is then formed to have a foot 405 as shown in FIG. 4b. Foot 405 is formed by bending a portion of the tape to a desired angle with respect to that portion of the tape to which integrated circuit die 301 is inner lead bonded. This is accomplished in any convenient manner such that foot 405 is attached to the remainder of the tape via radius 406 which might either be a smooth curve or which may be formed of several sharper bends so as to provide the desired angle between foot 405 and the remainder of the tape. While FIG. 4b is a cross-sectional view, it will be readily appreciated that foot 405 includes a plurality of metallization leads which will be outer lead bonded to the substrate.

FIG. 5 is a cross-sectional view depicting a plurality of tape mounted integrated circuits, where the tape units 400 are outer lead bonded to substrate 501. Substrate 501 may comprise, for example a printed circuit board or a ceramic substrate, or any other convenient substrate. Substrate 501 includes a plurality of metal traces (not shown) on its surface to which are outer lead bonded the corresponding metallic traces contained on foot 405 of each of the integrated circuit tape assemblies 400. As shown in FIG. 5, extremely high packing density is provided since the pitch T between adjacent integrated circuit tape assemblies can be made extremely small. In fact, pitch T is dictated by the thickness of the integrated circuit tape assembly 400 (including the integrated circuits mounted thereon) plus the length of its foot 405. Foot 405 need only be sufficiently large to provide for adequate outer lead bonding using, for example, conventional solder reflow or thermo compression outer lead bonding techniques utilizing a suitably small outer lead bonding tool. As an example, but not to be construed as a limitation on the scope of this invention, pitch T is typically on the order of approximately 50 to 150 mils.

As shown in FIG. 5, individual integrated circuit assemblies 400 are capable of being outer lead bonded to a common substrate 501, thereby providing a very high density of electronic components. Furthermore, since a plurality of individual integrated circuit tape assemblies 400 are mounted to substrate 501, increased yield is possible as compared with the prior art. This is true because individual integrated circuit tape assemblies 400 are assembled and tested prior to being outer lead bonded to substrate 501. Furthermore, in the event a problem develops during or after the assembly of an individual integrated circuit tape assembly 400 by its outer lead bonding to substrate 501, that individual integrated circuit tape assembly 400 can be removed and a replacement substituted.

The integrated circuits contained within integrated circuit tape assemblies 400 may be capsulated in any convenient manner. In one embodiment of this invention, the integrated circuits are not encapsulated in the traditional sense, for example by using epoxy, but rather the entire subassembly 500 including substrate 501 and integrated circuit tape assemblies 400 is immersed in a substantially inert environment. For example, subassembly 500 is immersed in a bath of inert liquid, such as a fluorocarbon liquid of the type available from, for example, 3M Corporation. This allows the integrated circuits, as well as their inner lead bonds and outer lead bonds, to be maintained in a noncorrosive environment. This also provides a large cooling capacity whereby the individual integrated circuits are maintained at a relatively low temperature, thereby enhancing the operation of the integrated circuits.

Figure 6A:
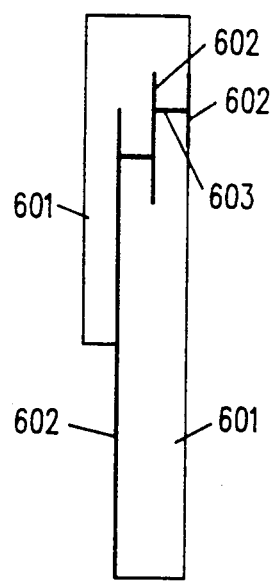
FIGS. 6a and 6b depict a tape structure, before and after forming.
Figure 6B:
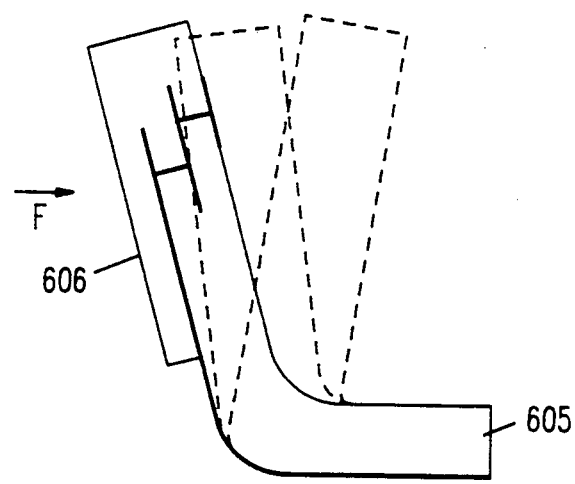
Figure 7A:
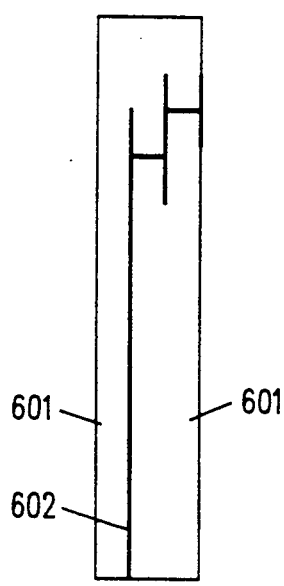
FIGS. 7a and 7b depict another tape structure before and after forming.
Figure 7B:
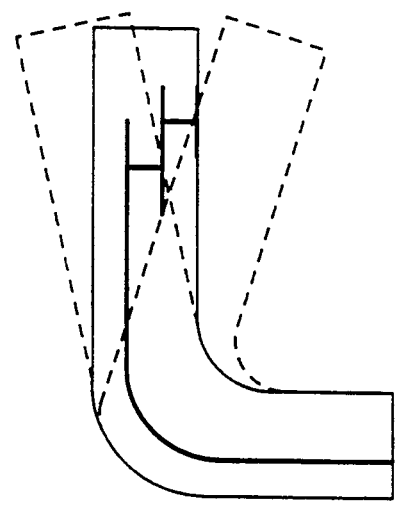

FIG. 6a depicts a cross-sectional view of a tape carrier structure including a dielectric film such as polyimide 601 and one or more layers of metallic interconnects 602 (typically copper) and electrical vias 603. The tape structure of FIG. 6a is formed as shown in FIG. 6b in an attempt to form a desired angle (typically 90°) by clamping region 605 and applying a forming force F to region 606. Unfortunately, this results in an unpredictable and widely varying form angle. This is true with regard to the tape structure shown in FIG. 6a, in which metallic leads 602 in the region of the bend are covered on one side with dielectric film 601, and in the tape structure of FIG. 7a in which metallic leads 602 integration of the bend is covered on both sides by dielectric film 601. Furthermore, applied a forming force F to that portion of the tape structure upon which the integrated circuit die is inner lead bonded is likely to result in damage to the integrated circuit or the inner lead bonds, thereby causing a yield loss.

In accordance with the teachings of this invention, a novel tape structure 800 is provided as shown in FIG. 8a. Tape structure 800 includes one or more layers of metallic interconnects 802 as well as dielectric portions 803 and 804. Of importance, metallic interconnects 802 within window region 120 where the bend is to be formed are free of dielectric material on both sides. Thus, in response to the application of forming force F, as shown in FIG. 8b, a highly controlled and predictable bend angle is provided which is highly consistent from unit to unit. This achieved because no dielectric is located within forming window 120 and thus the deleterious effect on the bending angle attributed to the presence of the dielectric film in the region to be formed is avoided.

FIG. 9 depicts a cross-sectional view of a formed structure including integrated circuit die 901 which is inner lead bonded to metallic interconnects 905. Metallic interconnects 905 are formed on dielectric film 902 and 906 which is notably absent in window region 120 where the electrical interconnects 905 are formed to a desired angle, in this example approximately 90°. Shown electrically and mechanically connected by interconnections 904 to metallic regions on the side of dielectric film 902 opposite integrated circuit die 901 is external component 903 such as a chip capacitor.

Figure 10:
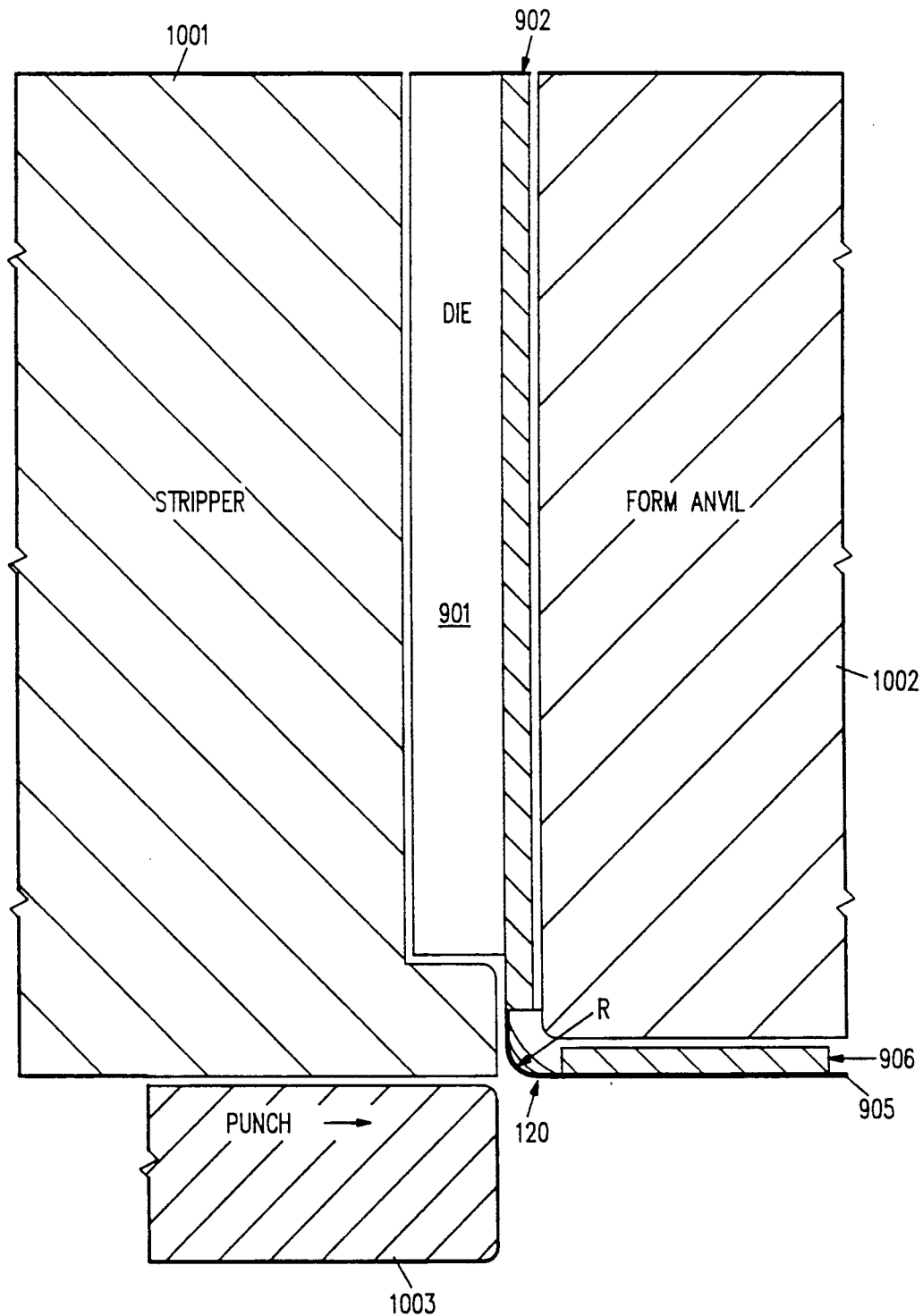
FIGS. 10-12 depict various embodiments of forming tools constructed in accordance with the teachings of this invention.

FIG. 10 is a cross-sectional view depicting one structure and method for forming the tape interconnect structure of FIG. 9, although for clarity not showing external component 903 attached to the back side of dielectric tape 902. The portion of the tape interconnecting unit to which integrated circuit die 901 is inner lead bonded is held in place by stripper 1001 which is formed with a recess to receive die 901, and form anvil 1002. Punch 1003 is then moved in the direction shown by the arrow in order cause radius R to be formed in metallic interconnects 905 within window 120. In accordance with this invention, integrated circuit die 901 is held in place during the forming process, thereby minimizing the potential for damage to integrated circuit die 901 and the inner lead bonds.

In the embodiment shown in FIG. 10, radius R is formed in a "uncontrolled" manner in that form anvil 1002 is not in contact with metallic interconnects 905 at radius R. In spite of this, in accordance with this invention, radius R is formed to a high accuracy and highly controllable from unit to unit.

Figure 11:
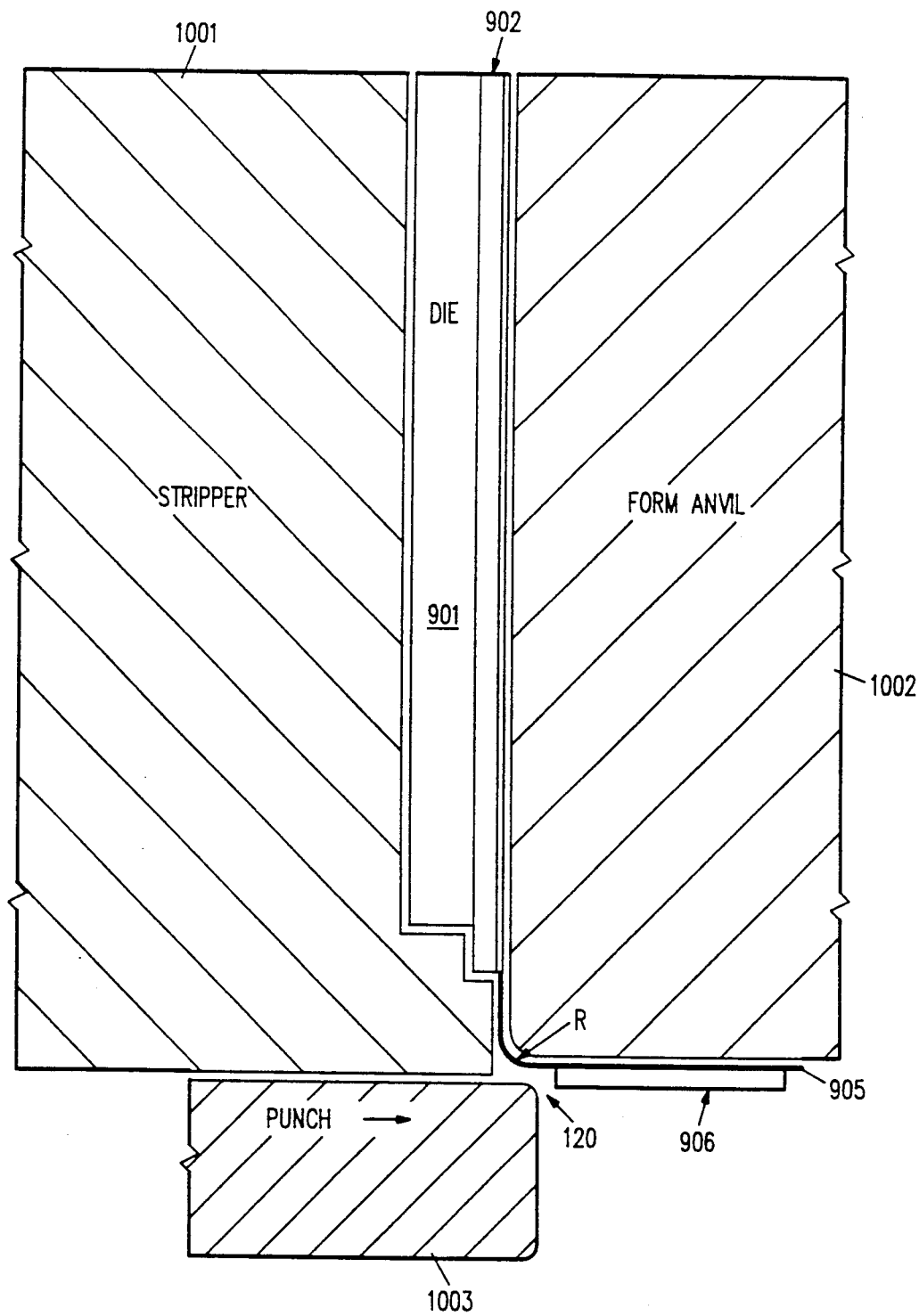

FIG. 11 is a cross-sectional view of an alternative embodiment of a method and structure for forming tape interconnect structures in accordance with the teachings of this invention. In this embodiment, dielectric tape 906 is formed on the opposite side of metallic interconnects 905 as compared with the embodiment of FIG. 10. This allows form anvil 1002 to be in contact with metallic interconnects 905 at radius R, thereby providing a more "controlled" forming.

Figure 12:
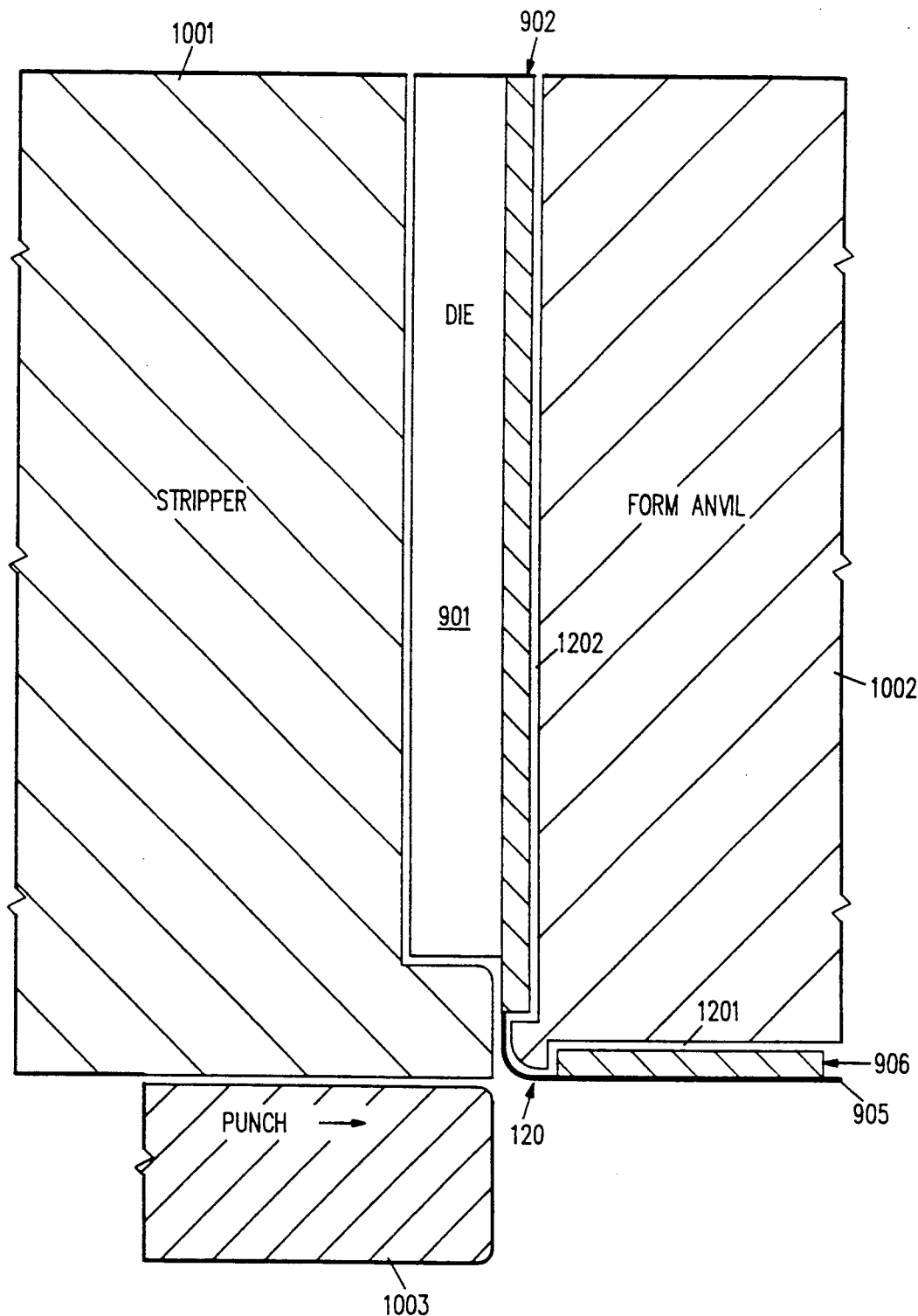

In an alternative embodiment of this invention, shown in FIG. 12, form anvil 1002 includes one or more recesses 1201, 1202 to allow dielectric films 902 and 906 to be recessed within form anvil 1002. This allows form anvil 1002 to be in contact with metallic interconnects 905 where radius R is formed, as shown.

All publications and patent applications are herein incorporated by reference to the same extent as if each individual publication or patent application was specifically and individually indicated to be incorporated by reference.

The invention now being fully described, it will be apparent to one of ordinary skill in the art that many changes and modifications can be made thereto without departing from the spirit or scope of the appended claims.

What is claimed is:

1. A semiconductor device package comprising:
   a substrate including a first surface; and
   a plurality of individual integrated circuit tape assemblies electrically and physically mounted on said substrate, each of said individual integrated circuit tape assemblies comprising:
   a first tape portion having a first surface including metallic interconnects to which is inner lead bonded an integrated circuit, said first tape portion being disposed such that said first surface is at a selected non zero angle from said first surface of said substrate;
   a second tape portion having a first surface including metallic interconnects which are outer lead bonded to said first surface of said substrate; and
   a formed portion connecting said first and second tape portions, said formed portion serving to cause said first tape portion to be disposed at said selected non zero angle from said second tape portion, said formed portion comprising metallic interconnects and being substantially devoid of said tape.

2. A structure as in claim 1 wherein said first tape portion includes a third tape portion which extends generally above said integrated circuit, and including a first surface having said metallic interconnects for said inner lead bonding to said integrated circuit.

3. A structure as in claim 2 wherein said third tape portion comprises:
   a first region having on said first surface a first plurality of locations for inner lead bonding to associated bonding locations on said integrated circuit;
   a second region having on said first surface a second plurality of locations for inner lead bonding to associated bonding locations on said integrated circuit; and one or more electrical interconnects extending on said third tape portion generally from said first region to said second region to provide electrical connection to said second plurality of locations for inner lead bonding.

4. An integrated circuit tape assembly comprising:
a first tape portion having a first surface including metallic interconnects for inner lead bonding to an integrated circuit;
a second tape portion having a first surface including metallic interconnects for outer lead bonding to a substrate; and
a formed portion connecting said first and second tape portions, said formed portion serving to cause said first tape portion to be disposed at a selected non zero angle from said second tape portion, said formed portion including metallic interconnects and being substantially devoid of said tape.

5. A structure as in claim 4 which further comprises a third tape portion formed as part of said first tape portion and extending generally above said integrated circuit, and having a first surface including said metallic interconnects for said inner lead bonding to said integrated circuit.

6. A structure as in claim 5 wherein said third tape portion comprises:
a first region having on said first surface a first plurality of locations for inner lead bonding to associated bonding locations on said integrated circuit;
a second region having on said first surface a second plurality of locations for inner lead bonding to associated bonding locations on said integrated circuit; and
one or more electrical interconnects extending generally from said first region to said second region to provide electrical connection to said second plurality of locations for inner lead bonding.

* * * * *